United States Patent
Tuttle et al.

[11] Patent Number: 5,849,632
[45] Date of Patent: Dec. 15, 1998

[54] METHOD OF PASSIVATING SEMICONDUCTOR WAFERS

[75] Inventors: Mark E. Tuttle; Trung Tri Doan, both of Boise, Id.

[73] Assignee: Micron Technology, Inc., Boise, Id.

[21] Appl. No.: 918,930

[22] Filed: Jul. 22, 1992

Related U.S. Application Data

[63] Continuation of Ser. No. 753,354, Aug. 30, 1991, abandoned.

[51] Int. Cl.$^6$ .................................................. H01L 21/316
[52] U.S. Cl. ........................... 438/633; 438/958; 438/763
[58] Field of Search ..................... 437/195, 228, 437/249, 980; 156/636; 438/624, 692, 633, 763, 958

[56] References Cited

U.S. PATENT DOCUMENTS

| | | | |
|---|---|---|---|
| 3,788,894 | 1/1974 | Scherber | 437/187 |
| 4,541,169 | 9/1985 | Bartush | 437/187 |
| 4,671,851 | 6/1987 | Beyer et al. | 437/249 |
| 4,952,528 | 8/1990 | Abe et al. | 437/195 |

FOREIGN PATENT DOCUMENTS

| | | |
|---|---|---|
| 63-318742 | 12/1988 | Japan . |
| 3209823 | 9/1991 | Japan . |

OTHER PUBLICATIONS

S.K. Ghandhi, *VLSI Fabrication Principles*, John Wiley and Sons, New York, 1983, pp. 420–430.
S. Wolf, *Silicon Processing for the VLSI Era*, vol. 2, Lattice Press, Sunset Beach, CA, 1990 pp. 273–276.
S. Wolf, *Silicon Processing for the VLSI Era: vol. 2*, Lattice Press, 1990, pp. 208–209 and 238–239.

*Primary Examiner*—Tuan H. Nguyen
*Assistant Examiner*—Matthew Whipple
*Attorney, Agent, or Firm*—Wells, St. John, Roberts, Gregory & Matkin P.S.

[57] ABSTRACT

A method of passivating an outer portion of a semiconductor wafer comprises: a) applying and patterning a metal layer to define conductive metal runners projecting atop the wafer, the conductive metal runners projecting outwardly from the wafer at given distances; b) applying an insulating dielectric layer atop the wafer to a thickness which is greater than the given distance of a furthest projecting metal runner; c) global planarizing the insulating dielectric layer to some point on the wafer which is elevationally above the underlying conductive metal runners; the preferred method is by chemical mechanical polishing; and d) applying a planar layer of an effective mechanical protection, chemical diffusion barrier and moisture barrier material atop the globally planarized layer of insulating dielectric.

1 Claim, 3 Drawing Sheets

METHOD OF PASSIVATING SEMICONDUCTOR WAFERS

RELATED PATENT DATA

This patent resulted from a continuation application of U.S. patent application Ser. No. 753,354, filed Aug. 30, 1991, now abandoned.

TECHNICAL

This invention relates generally to passivation of upper surfaces of semiconductor wafers.

BACKGROUND OF THE INVENTION

The approach used in building integrated circuits on monolithic pieces of silicon involves the fabrication of successive layers of insulating, conducting, and semiconducting materials. Each layer is patterned to form a structure that performs a specific function, usually linked with surrounding areas and subsequent layers. One of the last layers put on the wafer is a final metal layer which will extend to bonding pads which will ultimately connect the chip circuitry to external devices, such as input or output devices.

Following the patterning of this final metal layer, a passivation layer is deposited over the entire top surface of the wafer. The passivation layer is an insulating and protective layer which prevents mechanical and chemical damage during assembly and packaging. The passivation layer will be finally masked and etched to define patterns corresponding to the bonding regions in which electrical contact to the finished circuit will be made.

The passivation layer preferably provides several attributes. For example, the passivation layer should be impermeable to moisture and sodium atoms, and other highly mobile impurities. It should adhere well to the conductive metal runners as well as to the dielectric layer therebeneath. It should provide scratch protection to the underlying circuits, with thicker passivation layers generally providing greater protection. As well, it should exhibit low stress and have thermal expansion/contraction properties somewhat aligned with the underlying metal and upper interlevel dielectric. Passivation layers typically comprise one or more of doped $SiO_2$, spin-on glass (SOG), silicon nitride, oxynitride, and combinations thereof. Passivation technology is described generally in S. Wolf, "Silicon Processing for the VLSI Era" Vol. 2—Process Integration, Lattice Press, Sun Beach, Calif., pp. 273–76, 1990, which is hereby incorporated by reference.

Predominant prior art passivation techniques are described with reference to FIGS. 1–4 of this disclosure. FIG. 1 illustrates a common technique utilizing a two-layer stack of phosphorus doped silicon dioxide overlaid with silicon nitride. Specifically, FIG. 1 illustrates a semiconductor wafer 10 having a bulk substrate region 11, field oxide regions 12, interlevel conductive runners 14, and an interlevel isolating dielectric layer 16. A metal layer has been applied and patterned atop layer 16 to define a series of projecting conductive metal runners 18. Thereafter, a thin phosphorus doped layer 20 of $SiO_2$ is applied over layer 16 and runners 18. A thicker nitride layer 22 (typically $Si_3N_4$) is applied atop layer 20. Finally, a layer 24 of an organic/plastic-like material such as polyimide is applied atop layer 22 to further encapsulate the wafer.

One goal in providing passivation is to provide an overall thin layer to minimize thermal expansion differences between the passivation layer(s) and underlying metal and dielectric. However, this "thin layer" objective competes with the desire to create a thick passivation layer to provide greater scratch or other damage protection.

$SiO_2$ in the described and illustrated example is applied first as it is a very good insulator (low dielectric constant) having hardness/thermal expansion properties which closely match those of the underlying substrate materials. However, $SiO_2$ is a poor moisture and Na barrier. $Si_3N_4$ on the other hand is an excellent mechanical protection, chemical diffusion barrier, and moisture barrier material, but has film stress properties which can be detrimental to the metallization layers. Additionally, the $Si_3N_4$ has a high dielectric constant which makes it a rather poor choice due to cross-talk between metal lines. Even in the depicted FIG. 1 construction, the $Si_3N_4$ in part because of the thinness of the $SiO_2$ layer has a large effect on the metal line to metal line capacitance and deteriorates the electrical performance of the circuit. Additionally, the gaps between metal lines 18 which include dielectric material 24 provides an additional adverse effect of a variable dielectric constant depending upon the amount of moisture within material 24. This has been shown to cause bake recoverable failures of such chips.

Further, the existing construction creates vertical and other steeply angled surfaces which can generate cracks in the dielectric or even in the bulk substrate 11 caused by forces exerted by the finished package. Such is illustrated by FIGS. 2 and 3. FIG. 2 is an enlarged view of a single one of runners 18 illustrated in FIG. 1. As illustrated, sharp jagged corners 25 are generated adjacent opposite sides of runners 18. In operation or over time due in large part to the differences in thermal expansion properties of the various materials, movement and distortion of the various materials can cause cracks 30 (FIG. 3). As illustrated, the action can tend to distort or pull the metals to one side or the other. The cracks 30 which result can expose the metal and other underlying materials to the atmosphere and moisture which can lead to destruction of the circuit. Further, angled or vertical surfaces 26 are detrimental causing the encapsulation material to "bind" on these angled protrusions 26 during expansion or contraction and generate stresses and cracks in the dielectric, metal, and substrate.

One prior art method of overcoming some of these problems includes a technique utilizing SOG (spin on glass). Such is described with reference to FIG. 4. There illustrated is the upper portion of a wafer 40 having an interlevel dielectric layer 42 with patterned metal runners 44 positioned thereatop. A layer 46 of phosphorus doped $SiO_2$ is applied atop layer 42 and runners 44. Thereafter, a layer 48 of SOG is applied. SOG has a tendency to be less conformal providing greater coverage or material in the voids between runners 44 than on the area atop runners 44. Consequently although jagged corners 25 remain with respect to the applied layer of $SiO_2$, the effect of such corners are passivated somewhat by the more gradual sloping of SOG layer applied thereatop. After application of SOG layer 48, a layer 50 of $Si_3N_4$ is applied, followed by a plastic/organic layer 52. Although this technique alleviates some of the problems, SOG is not without inherent drawbacks. Even though SOG is predominantly $SiO_2$, SOG does not provide as dense a coating as pure $SiO_2$ or boron and/or phosphorus doped $SiO_2$ (BPSG). Further, SOG is very porous and contains undesirable impurities. In addition, the angled protrusions 26 are still present.

It is an object of the invention to overcome many of the above and additional drawbacks associated with present passivation techniques.

BRIEF DESCRIPTION OF THE DRAWINGS

One or more preferred embodiments of the invention are described with reference to the accompanying drawings which are briefly described below.

DETAILED DESCRIPTION OF PREFERRED EMBODIMENTS

This disclosure of the invention is submitted in furtherance of the constitutional purposes of the U.S. Patent Laws "to promote the progress of science and useful arts" (Article 1, Section 8).

In accordance with the invention, a method of passivating an outer portion of a semiconductor wafer comprises the following steps:

applying and patterning a metal layer to define conductive metal runners projecting atop the wafer, the conductive metal runners projecting outwardly from the wafer at given distances;

applying an insulating dielectric layer atop the wafer to a thickness which is greater than the given distance of a furthest projecting metal runner;

global planarizing the insulating dielectric layer to some point on the wafer which is elevationally above the underlying conductive metal runners; and applying a planar layer of an effective mechanical protection, chemical diffusion barrier, and moisture barrier material atop the globally planarized layer of insulating dielectric.

The most preferred global planarizing method in accordance with the invention at this writing is chemical mechanical polishing (CMP). Alternate, but much less preferred planarization techniques include photoresist etch back (REB) and dielectric melt and reflow techniques, which would typically employ doped $SiO_2$ dielectric. The preferred insulating dielectric is undoped $SiO_2$, preferably applied by plasma enhanced chemical vapor deposition (PECVD). The preferred mechanical protection, chemical diffusion barrier, and moisture barrier material is $Si_3N_4$ provided by PECVD of $SiH_4$ and $NH_3$.

Figure 5:
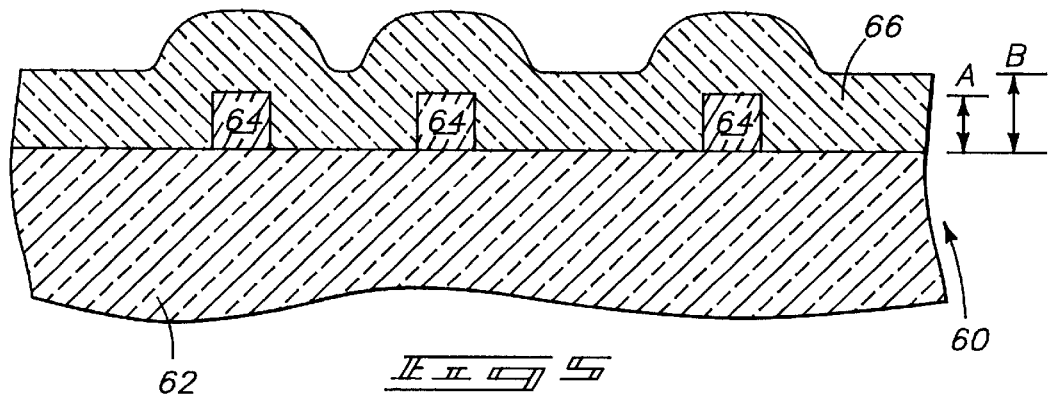
FIG. 5 is a diagrammatic section view of a wafer fragment processed in accordance with the invention.

A preferred embodiment for practicing the invention is described below with reference to FIGS. 5–8. FIG. 5 illustrates an upper portion of a wafer fragment 60 having an interlevel dielectric layer 62. A layer of metal has been patterned and applied atop dielectric layer 62 to define a series of conductive metal runners 64 projecting upwardly from layer 62. The invention will have its greatest applicability when the distances separating runners 64 are approximately 1.2 microns or less and when die sizes are greater than 30 mm². It is at these smaller line dimensions and larger die sizes where the problems as identified in the "Background" section above predominate. Conductive metal runners 64 project outwardly from layer 62 at a given distance "A". Although metal runners 64 might be provided atop layer 62 at varying distances, in the described embodiment and most typically runners 64 will project from layer 62 at the same distance "A".

After patterning to produce conductive runners 64, a layer 66 of insulating dielectric is applied atop layer 62 and runners 64 to a thickness "B" which is greater than the given distance of a furthest projecting metal runner, which in the described example is distance "A".

Figure 6:
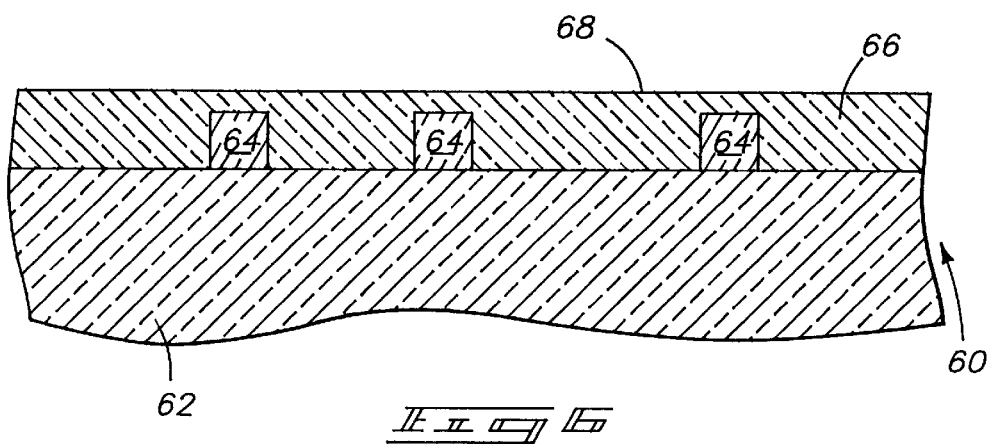
FIG. 6 is a diagrammatic section view of the FIG. 5 wafer at a processing step subsequent to that illustrated by FIG. 5.

Referring to FIG. 6, layer 66 is globally planarized preferably by chemical mechanical polishing to provide a substantially planar upper surface 68 at a location on wafer 60 which is elevationally above underlying conductive metal runners 64 and essentially complete removal of angled protrusions 26. An example chemical mechanical polishing technique would utilize a pH controlled colloidal silica slurry at 125° F. and 5 psig.

Figure 7:
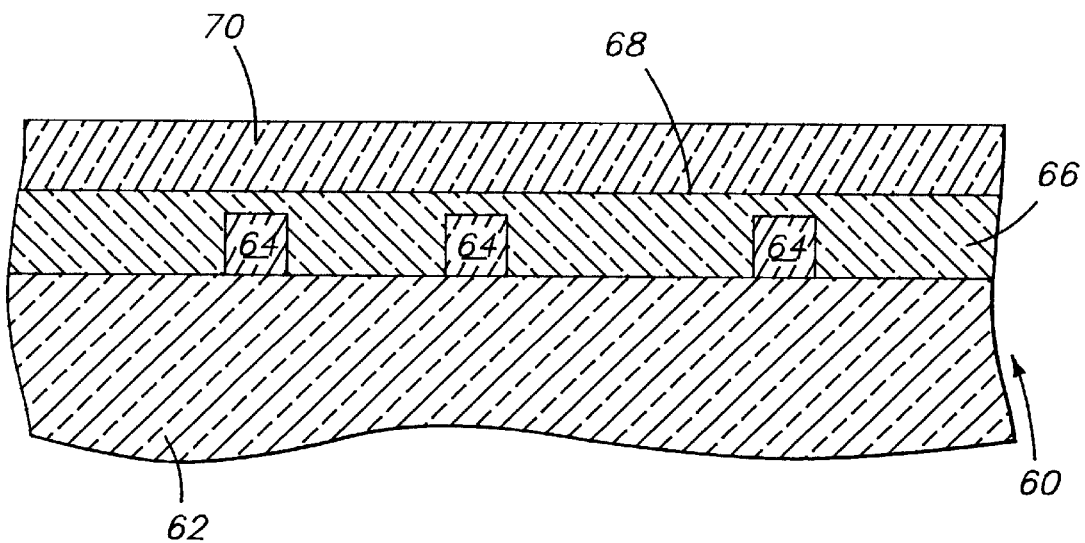
FIG. 7 is a view of the FIG. 5 wafer at a processing step subsequent to that illustrated by FIG. 6.
Figure 8:
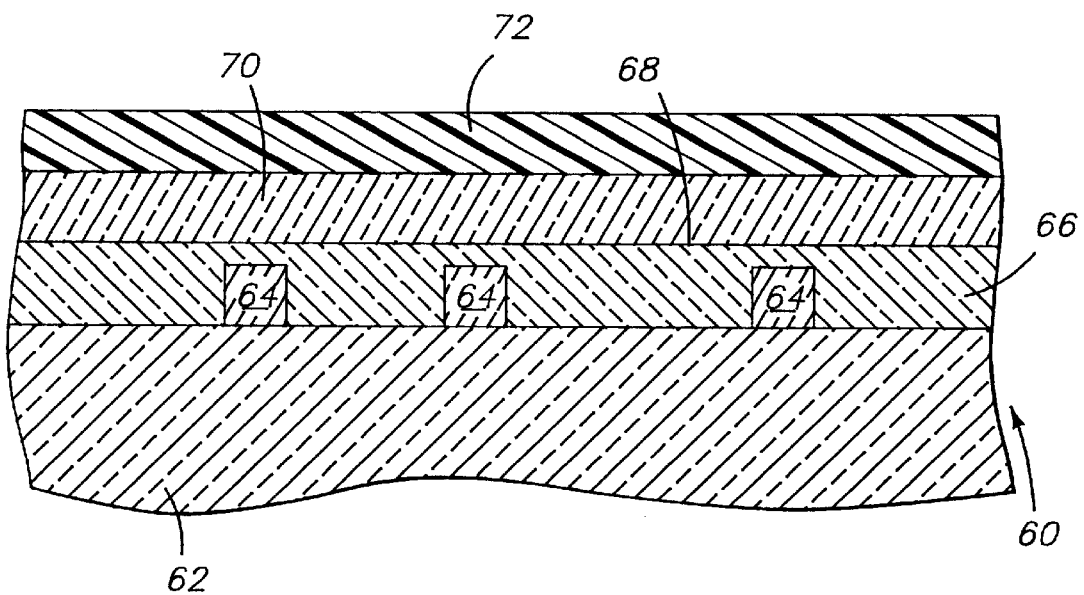
FIG. 8 is a view of the FIG. 5 wafer at a processing step subsequent to that illustrated by FIG. 7.

Referring to FIG. 7, a planar layer 70 of $Si_3N_4$ is applied atop chemical mechanical polished planarized layer 66, which is ultimately followed by an outer organic/plastic layer 72.

Figure 1:
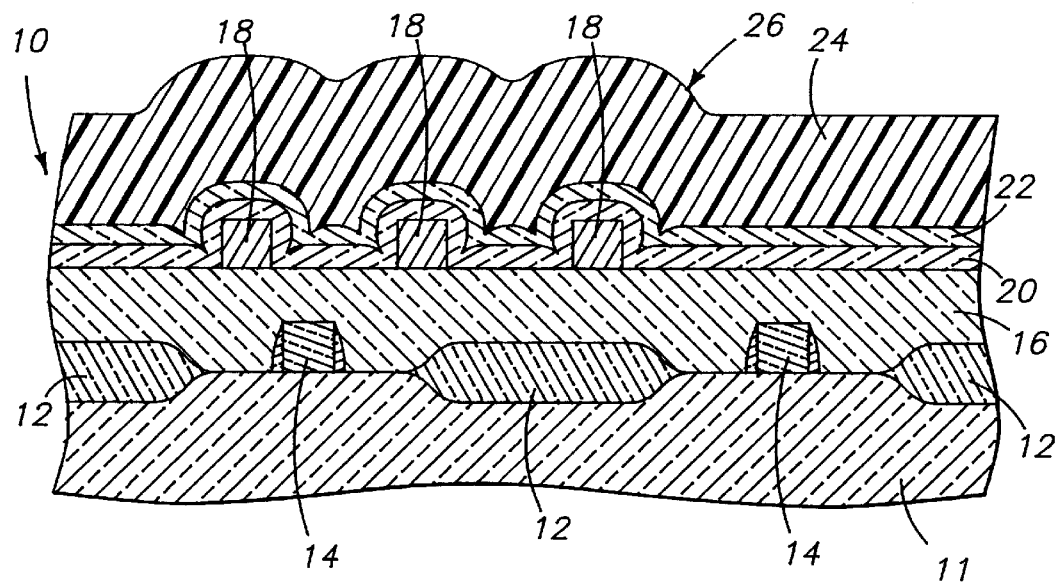
FIG. 1 is a diagrammatic section view of a wafer fragment and is described in the "Background" section above.
Figure 2:
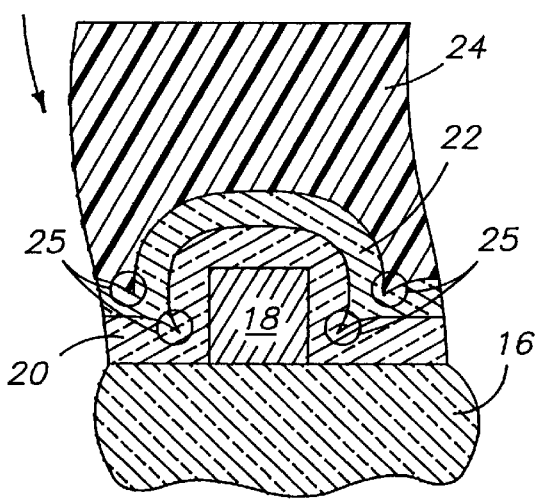
FIG. 2 is an enlarged portion of FIG. 1 and is described in the "Background" section above.
Figure 3:
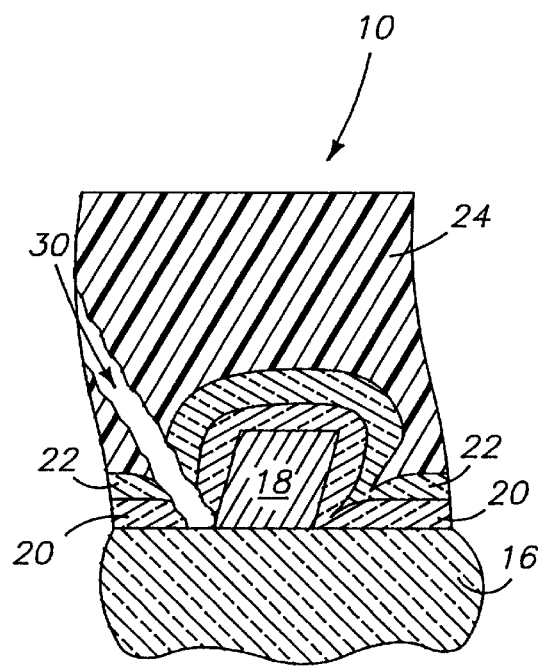
FIG. 3 is a diagrammatic section view illustrating the wafer fragment as having been adversely impacted by the environment, and is described in the "Background" section above.
Figure 4:
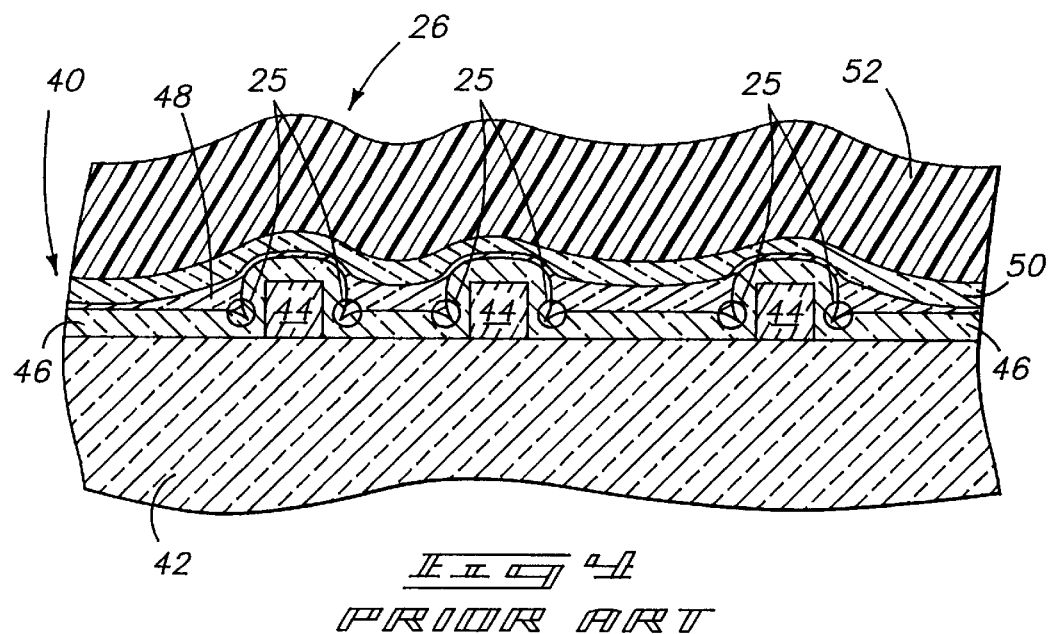
FIG. 4 is a diagrammatic section view of an alternate wafer fragment and is described in the "Background" section above.

The method provides an improved construction over the prior art in that there are no steeply angled/vertical surfaces which produce corners which can lead to the breaking illustrated by FIG. 3 or the cracking associated with the external angled/vertical surfaces which "bind" to the encapsulation material and allow stress to be transmitted to the substrate. Accordingly, an improved and novel wafer is produced according to the method.

In compliance with the statute, the invention has been described in language more or less specific as to structural and methodical features. It is to be understood, however, that the invention is not limited to the specific features shown and described, since the means and construction herein disclosed comprise preferred, forms of putting the invention into effect. The invention is, therefore, claimed in any of its forms or modifications within the proper scope of the appended claims appropriately interpreted in accordance with the doctrine of equivalents.

We claim:

1. A method of processing a semiconductor wafer to provide a composite passivation overcoat layer over a final patterned metal layer and to alleviate stress cracking tendency in the passivation layer, the method comprising the following steps:

applying and patterning a final metal layer to define conductive final upper metal runners projecting atop the wafer, the final upper conductive metal runners projecting outwardly from the wafer at given distances, at least some immediately adjacent of the conductive metal runners being spaced from one another 1.2 microns or less, said at least some immediately adjacent runners having outermost flat planar surfaces elevationally positioned at a common given distance from the wafer;

applying a first passivation layer of undoped $SiO_2$ which is deposited by a chemical vapor deposition method atop the wafer and final metal layer to a thickness which is greater than the given distance of a furthest projecting final metal runner, the first undoped $SiO_2$ passivation layer being in substantial contact with the outermost flat planar conductive metal runner surfaces;

chemical-mechanical polishing the undoped $SiO_2$ passivation layer downwardly to provide a completely flat planar passivation layer of undoped $SiO_2$ having a completely flat upper surface at a point on the wafer which is elevationally above all of the underlying conductive metal runners; and plasma enhanced chemical vapor depositing a completely flat planar passivation overcoating layer of $Si_3N_4$ atop the chemical-mechanical polished planarized passivation layer of undoped $SiO_2$ to impart mechanical protection, chemical diffusion protection, and a moisture barrier to the wafer, the completely flat planarity of the passivation undoped $SiO_2$ layer and the $Si_3N_4$ passivation overcoating layer resulting in greater stress cracking alleviation than if such completely flat planar layers were not present; and selectively etching the $Si_3N_4$ overcoating layer and undoped $SiO_2$ underlying passivation layer to bonding pads associated with the final metal runners.

* * * * *